United States Patent
Chen et al.

(10) Patent No.: US 9,473,142 B2
(45) Date of Patent: Oct. 18, 2016

(54) METHOD FOR PERFORMING SIGNAL DRIVING CONTROL IN AN ELECTRONIC DEVICE WITH AID OF DRIVING CONTROL SIGNALS, AND ASSOCIATED APPARATUS

(71) Applicant: MEDIATEK INC., Hsin-Chu (TW)

(72) Inventors: Shang-Pin Chen, Hsinchu County (TW); An-Siou Li, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/830,755

(22) Filed: Aug. 20, 2015

(65) Prior Publication Data
US 2016/0173093 A1 Jun. 16, 2016

Related U.S. Application Data

(60) Provisional application No. 62/090,893, filed on Dec. 12, 2014.

(51) Int. Cl.
*G11C 7/10* (2006.01)
*H03K 19/0175* (2006.01)

(52) U.S. Cl.
CPC ..... *H03K 19/017509* (2013.01); *G11C 7/1057* (2013.01)

(58) Field of Classification Search
CPC ..... G11C 7/10; G11C 7/1048; G11C 7/1051; G11C 7/1057; H03K 17/10; H03K 17/102; H03K 17/12; H03K 17/122; H03K 19/0175; H03K 19/017509; H03K 17/018; H03K 17/01806; H03K 17/0185; H03K 17/018507; H03K 17/018521
USPC ......... 326/82, 83, 87, 89, 91; 327/108, 109, 327/333
See application file for complete search history.

(56) References Cited

U.S. PATENT DOCUMENTS

| | | | | |
|---|---|---|---|---|
| 7,791,367 B1* | 9/2010 | Pelley | ........... | H03K 19/01858 326/30 |
| 7,944,233 B1* | 5/2011 | Lee | ........... | G11C 7/1051 326/27 |
| 8,674,747 B2* | 3/2014 | Iwasaki | ........... | H03K 19/01857 327/108 |
| 2002/0180483 A1 | 12/2002 | Lim | | |
| 2004/0252432 A1 | 12/2004 | Sasaki | | |
| 2007/0146004 A1* | 6/2007 | Park | ........... | G11C 5/063 326/30 |
| 2010/0142297 A1* | 6/2010 | Lee | ........... | G11C 7/1051 365/198 |
| 2011/0205832 A1* | 8/2011 | Jeon | ........... | G11C 7/1057 365/233.16 |

(Continued)

FOREIGN PATENT DOCUMENTS

EP 0 817 381 A2 1/1998

*Primary Examiner* — William Hernandez
(74) *Attorney, Agent, or Firm* — Winston Hsu; Scott Margo

(57) ABSTRACT

A method for performing signal driving control in an electronic device and an associated apparatus are provided. The method includes: generating a first driving control signal and a second driving control signal according to a data signal, wherein the second driving control signal transits in response to a transition of the data signal, and the first driving control signal includes a pulse corresponding to the transition of the data signal; and utilizing a first switching unit to control a first signal path between a first voltage level and an output terminal of an output stage according to the first driving control signal, and utilizing a second switching unit to control a second signal path between the first voltage level and the output terminal according to the second driving control signal, wherein a first impedance of the first signal path is less than a second impedance of the second signal path.

20 Claims, 4 Drawing Sheets

(56) References Cited

U.S. PATENT DOCUMENTS

2011/0242916 A1* 10/2011 Seol ................. G11C 5/063
                                                        365/198
2014/0269107 A1* 9/2014 Inoue ................. G11C 7/1057
                                                        365/189.05
2015/0256173 A1* 9/2015 Chen ................. H03K 19/0948
                                                        327/108

* cited by examiner

METHOD FOR PERFORMING SIGNAL DRIVING CONTROL IN AN ELECTRONIC DEVICE WITH AID OF DRIVING CONTROL SIGNALS, AND ASSOCIATED APPARATUS

CROSS REFERENCE TO RELATED APPLICATIONS

This application claims the benefit of U.S. Provisional Application No. 62/090,893, which was filed on Dec. 12, 2014, and is included herein by reference.

BACKGROUND

The present invention relates to performance control of integrated circuits (ICs), such as input/output (I/O) signal control for a plurality of I/O terminals of a semiconductor chip, and more particularly, to a method for performing signal driving control in an electronic device, and an associated apparatus.

In a conventional electronic device that is equipped with multiple ICs, I/O signal control regarding signals between the ICs is important since low quality of these signals may cause malfunction of the conventional electronic device. For example, in a situation where one of the ICs is a memory device such as a random access memory (RAM), low quality of the I/O signals of the memory device may cause data errors. According to the related art, some conventional methods are proposed in order to enhance the quality of the I/O signals of the memory device. However, some problems such as some side effects may occur. Thus, a novel method and a corresponding architecture are required to guarantee the performance of an electronic device that is equipped with multiple ICs with fewer design efforts and fewer side effects.

SUMMARY

It is an objective of the claimed invention to provide a method for performing signal driving control in an electronic device, and an associated apparatus, in order to solve the above-mentioned problems.

It is another objective of the claimed invention to provide a method for performing signal driving control in an electronic device, and an associated apparatus, in order to guarantee the performance of the electronic device with fewer design efforts and to improve the overall performance of the electronic device.

According to at least one preferred embodiment, a method for performing signal driving control in an electronic device is provided, where the method comprises the steps of: generating at least one of a first driving control signal and a second driving control signal according to a data signal, for controlling an output stage within the electronic device to output data carried by the data signal, wherein the second driving control signal transits in response to a transition of the data signal, and the first driving control signal comprises a pulse corresponding to the transition of the data signal; and utilizing a first switching unit to control a first signal path between a first voltage level and an output terminal of the output stage according to the first driving control signal, and utilizing a second switching unit to control a second signal path between the first voltage level and the output terminal according to the second driving control signal, wherein a first impedance of the first signal path is less than a second impedance of the second signal path.

According to at least one preferred embodiment, an apparatus for performing signal driving control in an electronic device is provided, where the apparatus comprises at least one portion of the electronic device. The apparatus may comprise a control module, a first switching unit that is coupled to the control module, and a second switching unit that may be coupled to the control module. The control module is arranged for generating at least one of a first driving control signal and a second driving control signal according to a data signal, for controlling an output stage within the electronic device to output data carried by the data signal, wherein the second driving control signal transits in response to a transition of the data signal, and the first driving control signal comprises a pulse corresponding to the transition of the data signal. In addition, the first switching unit is arranged for controlling a first signal path between a first voltage level and an output terminal of the output stage according to the first driving control signal. Additionally, the second switching unit is arranged for controlling a second signal path between the first voltage level and the output terminal according to the second driving control signal, wherein a first impedance of the first signal path is less than a second impedance of the second signal path.

It is an advantage of the present invention that the present invention method and the associated apparatus can guarantee the performance of the electronic device with fewer design efforts and fewer side effects, and can improve the overall performance of the electronic device. In addition, the present invention method and the associated apparatus can change at least one characteristic of at least one control signal of a specific stage to adjust a resultant I/O signal of an integrated circuit (IC) indifferent conditions (e.g. in response to different logical states of an intermediate digital signal), respectively, to satisfy various requirements, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
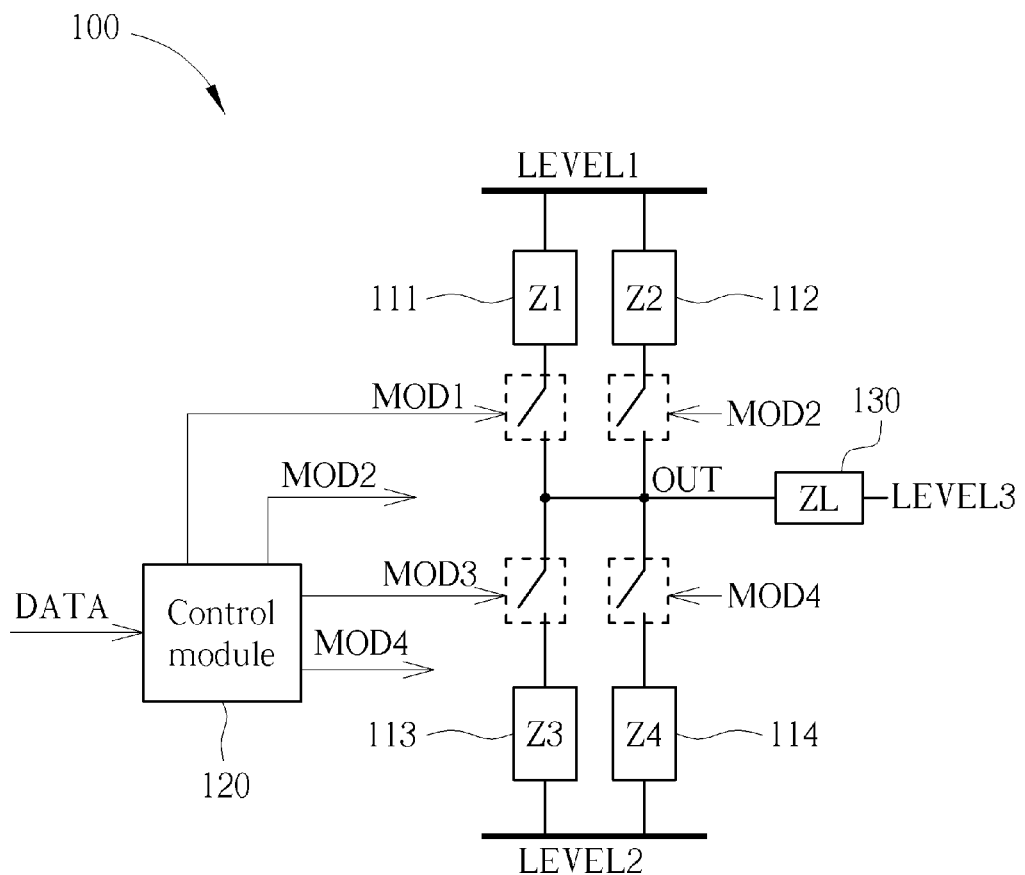
FIG. 1 is a diagram of an apparatus for performing signal driving control in an electronic device according to a first embodiment of the present invention.

FIG. 1 illustrates a diagram of an apparatus 100 for performing signal driving control in an electronic device according to a first embodiment of the present invention, where the apparatus 100 comprises at least one portion (e.g. a portion or all) of the electronic device. As shown in FIG. 1, the apparatus 100 may comprise a passive component 111 such as at least one component (e.g. one or more components) having an equivalent impedance Z1, a passive component 112 such as at least one component (e.g. one or more components) having an equivalent impedance Z2, a passive component 113 such as at least one component (e.g. one or more components) having an equivalent impedance Z3, and a passive component 114 such as at least one component (e.g. one or more components) having an equivalent impedance Z4, where the passive components 111, 112, 113, and 114 are positioned in an output stage within the electronic device. In addition, the apparatus 100 may comprise a plurality of switching units such as those positioned on some signal paths shown in the left half of FIG. 1, and may further comprise a control module 120 that is coupled to at least one portion (e.g. a portion or all) of the plurality of switching units. Additionally, the apparatus 100 may further comprise a passive component 130 such as at least one component (e.g. one or more components) having an equivalent impedance ZL, where the passive component 130 is coupled between an output terminal OUT of the output stage and a third voltage level LEVEL3.

According to this embodiment, the plurality of switching units may comprise a first switching unit, a second switching unit, a third switching unit, and a fourth switching unit. For example, the first switching unit and the passive component 111 are positioned on a first signal path between a first voltage level LEVEL1 and the output terminal OUT of the output stage, the second switching unit and the passive component 112 are positioned on a second signal path between the first voltage level LEVEL1 and the output terminal OUT, the third switching unit and the passive component 113 are positioned on a third signal path between a second voltage level LEVEL2 and the output terminal OUT, and the fourth switching unit and the passive component 114 are positioned on a fourth signal path between the second voltage level LEVEL2 and the output terminal OUT.

According to some embodiments, the output terminal OUT can be an output pad of an integrated circuit (IC) within the electronic device. For example, the electronic device may comprise a memory device such as a Random Access Memory (SDRAM), and this IC may comprise a memory interface circuit comprising the output stage mentioned above, where the output pad can be coupled to the memory device within the electronic device. This is for illustrative purposes only, and is not meant to be a limitation of the present invention. According to some embodiments of the present invention, the electronic device may comprise another type of circuits, and the output stage mentioned above may be positioned in any circuit of the other type of circuits.

Figure 2:
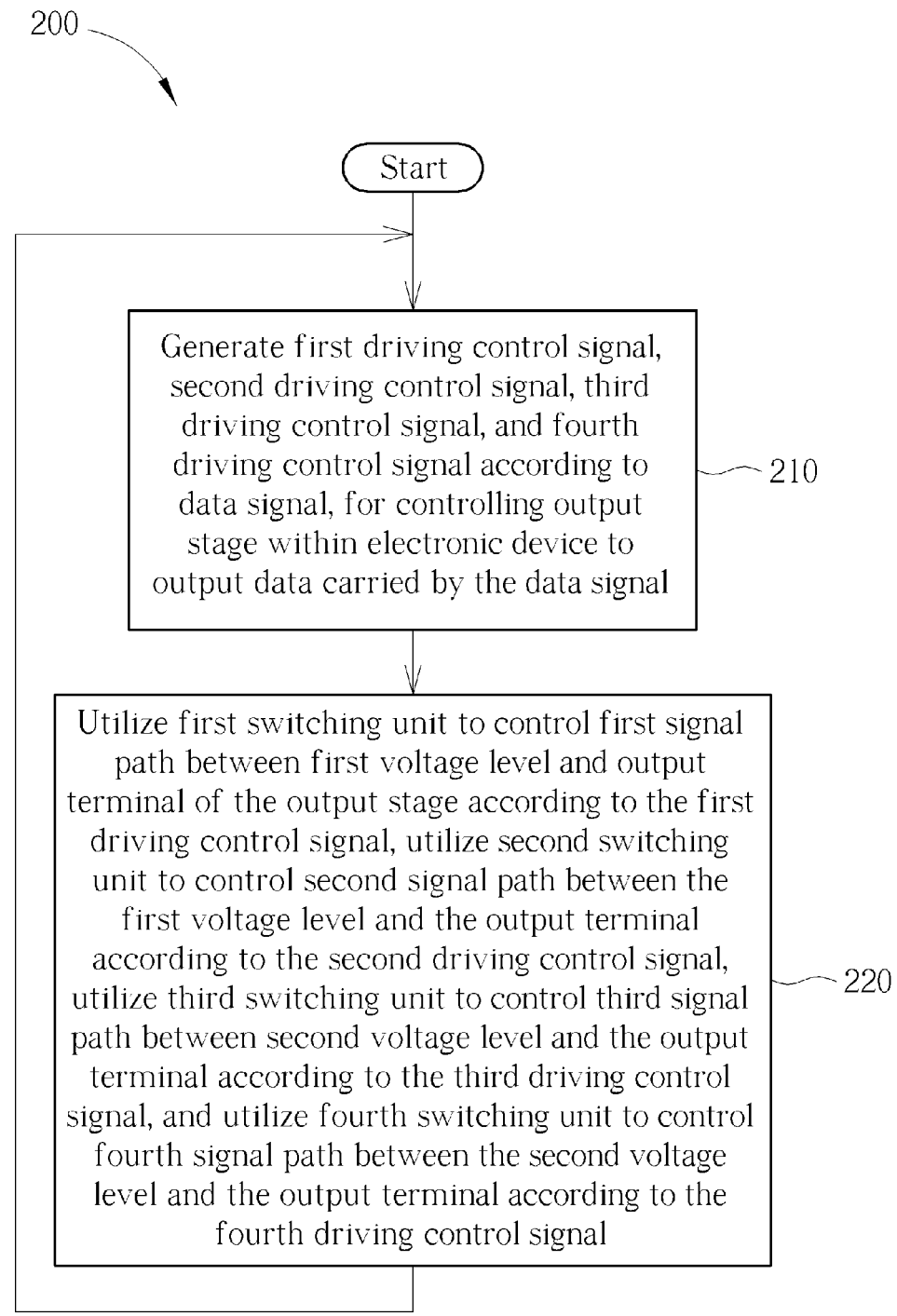
FIG. 2 illustrates a flowchart of a method for performing signal driving control in an electronic device according to an embodiment of the present invention.

FIG. 2 illustrates a flowchart of a method 200 for performing signal driving control in an electronic device according to an embodiment of the present invention. The method 200 shown in FIG. 2 can be applied to the apparatus 100 shown in FIG. 1. The method can be described as follows.

In Step 210, the apparatus 100 (more particularly, the control module 120) may generate a first driving control signal MOD1, a second driving control signal MOD2, a third driving control signal MOD3, and a fourth driving control signal MOD4 according to a data signal DATA, for controlling the output stage within the electronic device to output data carried by the data signal DATA. For example, at least one portion (e.g. a portion or all) of the first driving control signal MOD1, a second driving control signal MOD2, a third driving control signal MOD3, and a fourth driving control signal MOD4 may be generated by altering the data signal DATA. This is for illustrative purposes only, and is not meant to be a limitation of the present invention.

In Step 220, the apparatus 100 may utilize the first switching unit to control the first signal path between the first voltage level LEVEL1 and the output terminal OUT of the output stage according to the first driving control signal MOD1, utilize the second switching unit to control the second signal path between the first voltage level LEVEL1 and the output terminal OUT according to the second driving control signal MOD2, utilize the third switching unit to control the third signal path between the second voltage level LEVEL2 and the output terminal OUT according to the third driving control signal MOD3, and utilize the fourth switching unit to control the fourth signal path between the second voltage level LEVEL2 and the output terminal OUT according to the fourth driving control signal MOD4. For example, a first impedance of the first signal path (e.g. the equivalent impedance Z1) is less than a second impedance of the second signal path (e.g. the equivalent impedance Z2), and a third impedance of the third signal path (e.g. the equivalent impedance Z3) is less than a fourth impedance of the fourth signal path (e.g. the equivalent impedance Z4).

According to this embodiment, the second driving control signal MOD2 may transit (e.g. change from one state thereof to another state thereof, and more particularly, change from one voltage level thereof to another voltage level thereof) in response to a transition of the data signal DATA (e.g. a state transition thereof, and more particularly, a voltage level transition thereof), for example, under control of the control module 120. In addition, under control of the control module 120, the first driving control signal MOD1 may comprise a pulse corresponding to this transition of the data signal DATA. For example, under control of the control module 120, the fourth driving control signal MOD4 may transit (e.g. change from one state thereof to another state thereof, and more particularly, change from one voltage level thereof to another voltage level thereof) in response to this transition of the data signal DATA. Additionally, under control of the control module 120, the fourth driving control signal MOD4 may transit (e.g. change from one state thereof to another state thereof, and more particularly, change from one voltage level thereof to another voltage level thereof) in response to another transition of the data signal DATA (e.g. another state transition thereof, and more particularly, another voltage level transition thereof), for example, under control of the control module 120. Further, under control of the control module 120, the third driving control signal MOD3 may comprise a pulse corresponding to the other transition of the data signal DATA.

According to some embodiments, the fourth driving control signal MOD4 can be equivalent to an inverted signal of the data signal DATA. According to some embodiments, the second driving control signal MOD2 can be equivalent to the data signal DATA. According to some embodiments, the third driving control signal MOD3 does not comprise a pulse corresponding to the aforementioned transition of the data signal DATA.

According to some embodiments, no matter whether the equivalent impedance of each of the first switching unit, the second switching unit, the third switching unit, and the fourth switching unit can be neglected, the equivalent impedance Z1, the equivalent impedance Z2, the equivalent impedance Z3, and the equivalent impedance Z4 can be taken as examples of the first impedance of the first signal path, the second impedance of the second signal path, the third impedance of the third signal path, and the fourth impedance of the fourth signal path, respectively. This is for illustrative purposes only, and is not meant to be a limitation of the present invention. According to some embodiments of the present invention, the first impedance of the first signal path may comprise the equivalent impedance Z1 and the equivalent impedance (e.g. z1) of the first switching unit, the second impedance of the second signal path may comprise the equivalent impedance Z2 and the equivalent impedance (e.g. z2) of the second switching unit, the third impedance of the third signal path may comprise the equivalent impedance Z3 and the equivalent impedance (e.g. z3) of the third switching unit, and the fourth impedance of the fourth signal path may comprise the equivalent impedance Z4 and the equivalent impedance (e.g. z4) of the fourth switching unit.

According to some embodiments of the present invention, the apparatus 100 (more particularly, the control module 120) may generate at least one portion (e.g. a portion or all) of the first driving control signal MOD1, a second driving control signal MOD2, a third driving control signal MOD3, and a fourth driving control signal MOD4. For example, one of the first driving control signal MOD1, the second driving control signal MOD2, the third driving control signal MOD3, and the fourth driving control signal MOD4 may be a bypassed version of the data signal DATA. Thus, the apparatus 100 (more particularly, the control module 120) may bypass the data signal DATA and utilize the aforementioned bypassed version of the data signal DATA as the aforementioned one of the first driving control signal MOD1, the second driving control signal MOD2, the third driving control signal MOD3, and the fourth driving control signal MOD4, and may generate the other driving control signals within the first driving control signal MOD1, the second driving control signal MOD2, the third driving control signal MOD3, and the fourth driving control signal MOD4.

Figure 3:
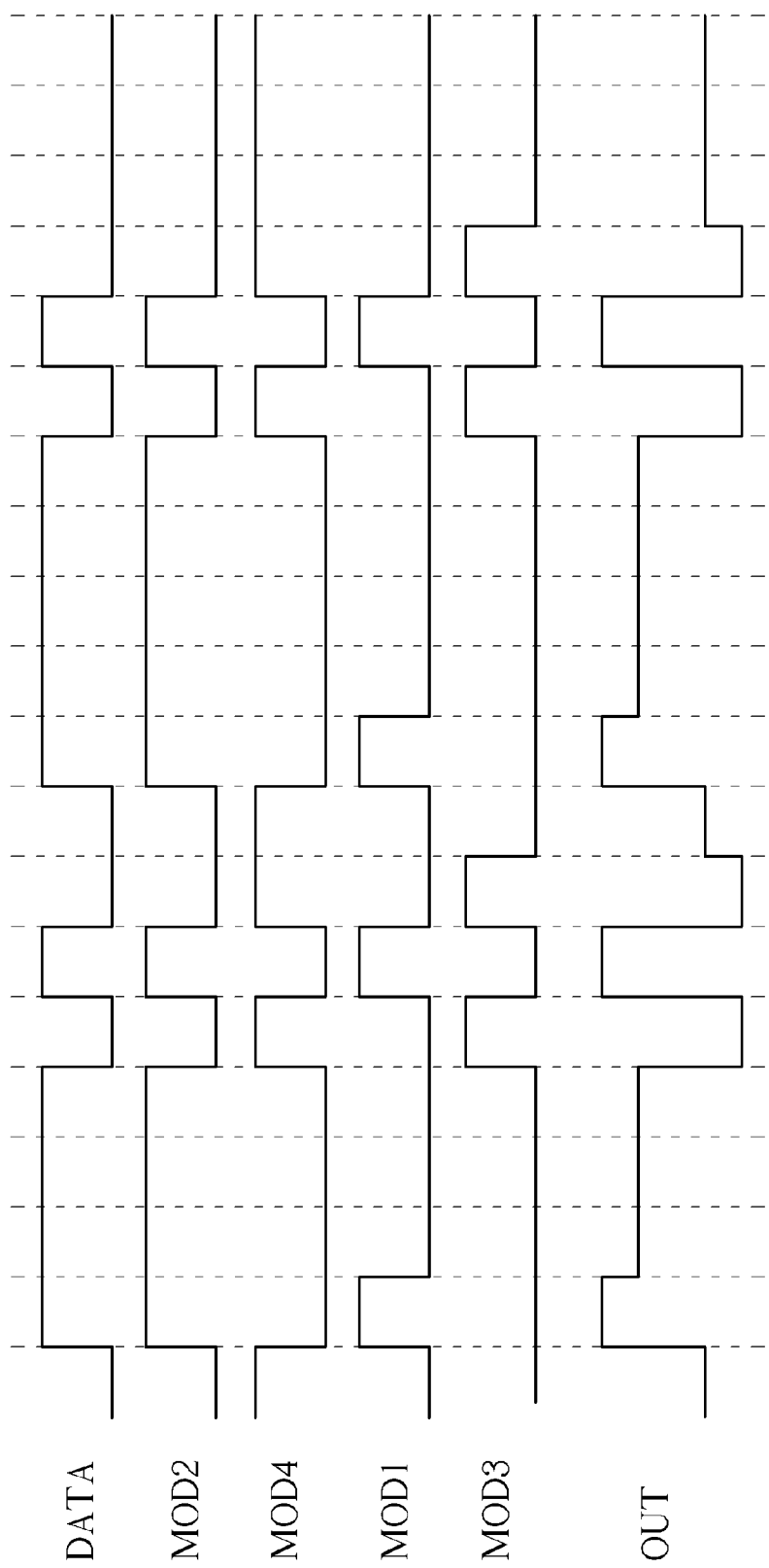
FIG. 3 illustrates a timing chart involved with the method shown in FIG. 2 according to an embodiment of the present invention.

FIG. 3 illustrates a timing chart involved with the method 200 shown in FIG. 2 according to an embodiment of the present invention. For example, the vertical dashed lines shown in FIG. 3 may indicate a series of time slots. In addition, the signal waveforms shown in FIG. 3 can be taken as examples of the data signal DATA, the second driving control signal MOD2, the fourth driving control signal MOD4, the first driving control signal MOD1, the third driving control signal MOD3, and the output signal at the output terminal OUT, respectively, where this output signal at the output terminal OUT can be labeled "OUT" in FIG. 3, for better comprehension.

Figure 4:
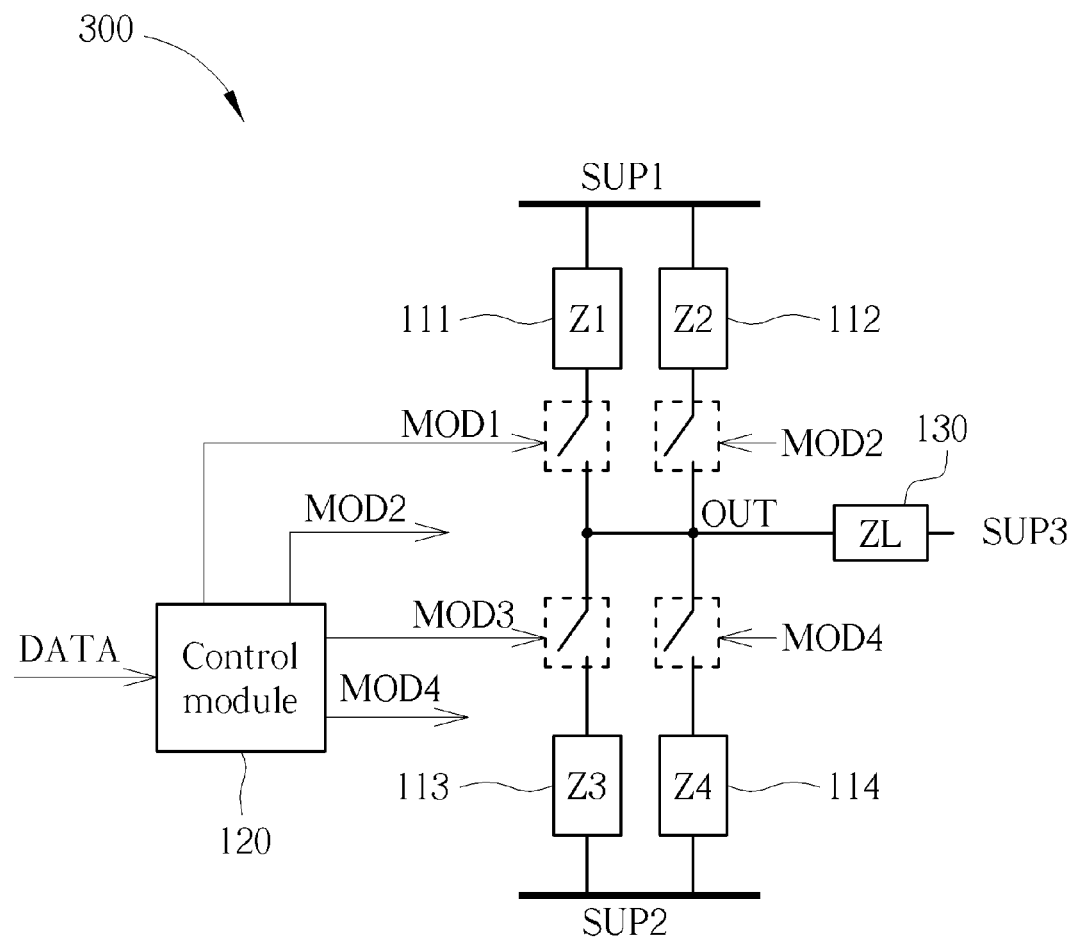
FIG. 4 illustrates a control scheme involved with the method shown in FIG. 2 according to an embodiment of the present invention.

As a result of utilizing the architecture shown in FIG. 1 and utilizing the first driving control signal MOD1, a second driving control signal MOD2, a third driving control signal MOD3, and a fourth driving control signal MOD4, the apparatus 100 may correctly generate the aforementioned output signal at the output terminal OUT. For example, in a situation where the data should be output at a high speed, the signal waveforms shown in FIG. 3 may cause this output signal to reach a required voltage level (e.g. a voltage level required by some specifications or some standards) in time, just at a time point when one of the transitions of the data signal DATA occurs. Therefore, the apparatus 100 can correctly output through the output terminal OUT the data carried by the data signal DATA FIG. 4 illustrates a control scheme involved with the method 200 shown in FIG. 2 according to an embodiment of the present invention. The components of the apparatus 300 shown in FIG. 4 and the associated operations of these components can be the same as that of the apparatus 100, respectively, except that some limitations may be further applied to the first voltage level LEVEL1, the second voltage level LEVEL2, and the third voltage level LEVEL3. For example, the first voltage level LEVEL1 can be a first supply voltage SUP1 of a power delivery network (PDN) within the electronic device. In addition, the second voltage level LEVEL2 can be a second supply voltage SUP2 of the PDN. More particularly, the third voltage level LEVEL3 can be a third supply voltage SUP3 of the PDN. For brevity, similar descriptions for this embodiment are not repeated in detail here.

According to some embodiments, the first voltage level LEVEL1 can be the first supply voltage SUP1 of the PDN, the second voltage level LEVEL2 can be a ground level of the PDN, and the third voltage level LEVEL3 can be a ground level of the electronic device. For example, the ground level of the PDN may be coupled to the ground level of the electronic device. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing signal driving control in an electronic device, the method comprising the steps of:

generating at least one of a first driving control signal and a second driving control signal according to a data signal, for controlling an output stage within the electronic device to output data carried by the data signal, wherein the second driving control signal transits in response to a transition of the data signal, and the first driving control signal comprises a pulse corresponding to the transition of the data signal; and utilizing a first switching unit to control a first signal path between a first voltage level and an output terminal of the output stage according to the first driving control signal, and utilizing a second switching unit to control a second signal path between the first voltage level and the output terminal according to the second driving control signal, wherein a first impedance of the first signal path is less than a second impedance of the second signal path.

2. The method of claim 1, wherein the output terminal is an output pad of an integrated circuit (IC) within the electronic device.

3. The method of claim 2, wherein the output pad is coupled to a memory device within the electronic device.

4. The method of claim 1, wherein the first voltage level is a first supply voltage of a power delivery network (PDN) within the electronic device.

5. The method of claim 1, wherein the second driving control signal is equivalent to the data signal.

6. The method of claim 1, further comprising:
generating a third driving control signal and a fourth driving control signal according to the data signal, for controlling the output stage within the electronic device to output the data carried by the data signal, wherein the fourth driving control signal transits in response to another transition of the data signal, and the third driving control signal comprises a pulse corresponding to the other transition of the data signal; and
utilizing a third switching unit to control a third signal path between a second voltage level and the output terminal according to the third driving control signal, and utilizing a fourth switching unit to control a fourth signal path between the second voltage level and the output terminal according to the fourth driving control signal, wherein a third impedance of the third signal path is less than a fourth impedance of the fourth signal path.

7. The method of claim 6, wherein the first voltage level is a first supply voltage of a power delivery network (PDN) within the electronic device, and the second voltage level is a second supply voltage of the PDN or a ground level of the PDN.

8. The method of claim 6, wherein the fourth driving control signal further transits in response to the transition of the data signal.

9. The method of claim 8, wherein the fourth driving control signal is equivalent to an inverted signal of the data signal.

10. The method of claim 6, wherein the third driving control signal does not comprise a pulse corresponding to the transition of the data signal.

11. An apparatus for performing signal driving control in an electronic device, the apparatus comprising at least one portion of an electronic device, the apparatus comprising:
a control module, arranged for generating at least one of a first driving control signal and a second driving control signal according to a data signal, for controlling an output stage within the electronic device to output data carried by the data signal, wherein the second driving control signal transits in response to a transition of the data signal, and the first driving control signal comprises a pulse corresponding to the transition of the data signal;
a first switching unit, coupled to the control module, arranged for controlling a first signal path between a first voltage level and an output terminal of the output stage according to the first driving control signal; and
a second switching unit, coupled to the control module, arranged for controlling a second signal path between the first voltage level and the output terminal according to the second driving control signal, wherein a first impedance of the first signal path is less than a second impedance of the second signal path.

12. The apparatus of claim 11, wherein the output terminal is an output pad of an integrated circuit (IC) within the electronic device.

13. The apparatus of claim 12, wherein the output pad is coupled to a memory device within the electronic device.

14. The apparatus of claim 11, wherein the first voltage level is a first supply voltage of a power delivery network (PDN) within the electronic device.

15. The apparatus of claim 11, wherein the second driving control signal is equivalent to the data signal.

16. The apparatus of claim 11, wherein the control module is further arranged for generating a third driving control signal and a fourth driving control signal according to the data signal, for controlling the output stage within the electronic device to output the data carried by the data signal, wherein the fourth driving control signal transits in response to another transition of the data signal, and the third driving control signal comprises a pulse corresponding to the other transition of the data signal; and the apparatus further comprises:
a third switching unit, coupled to the control module, arranged for controlling a third signal path between a second voltage level and the output terminal according to the third driving control signal; and
a fourth switching unit, coupled to the control module, arranged for controlling a fourth signal path between the second voltage level and the output terminal according to the fourth driving control signal, wherein a third impedance of the third signal path is less than a fourth impedance of the fourth signal path.

17. The apparatus of claim 16, wherein the first voltage level is a first supply voltage of a power delivery network (PDN) within the electronic device, and the second voltage level is a second supply voltage of the PDN or a ground level of the PDN.

18. The apparatus of claim 16, wherein the fourth driving control signal further transits in response to the transition of the data signal.

19. The apparatus of claim 18, wherein the fourth driving control signal is equivalent to an inverted signal of the data signal.

20. The apparatus of claim 16, wherein the third driving control signal does not comprise a pulse corresponding to the transition of the data signal.

* * * * *